United States Patent
Salinas et al.

(10) Patent No.: US 11,094,644 B2
(45) Date of Patent: Aug. 17, 2021

(54) INTEGRATED CIRCUIT WITH SCRIBE LANE PATTERNS FOR DEFECT REDUCTION

(71) Applicant: TEXAS INSTRUMENTS INCORPORATED, Dallas, TX (US)

(72) Inventors: Adrian Salinas, Garland, TX (US); William Keith McDonald, Kemp, TX (US); Scott Alexander Johannesmeyer, Richardson, TX (US); Robert Paul Luckin, Plano, TX (US); Stephen Arlon Meisner, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/679,997

(22) Filed: Nov. 11, 2019

(65) Prior Publication Data
US 2021/0104468 A1   Apr. 8, 2021

Related U.S. Application Data

(60) Provisional application No. 62/910,857, filed on Oct. 4, 2019.

(51) Int. Cl.
*G03F 7/20* (2006.01)
*H01L 21/027* (2006.01)
*H01L 23/544* (2006.01)

(52) U.S. Cl.
CPC ........ *H01L 23/544* (2013.01); *G03F 7/70125* (2013.01); *H01L 21/0274* (2013.01); *H01L 2223/5446* (2013.01)

(58) Field of Classification Search
CPC ............. G03F 7/70125; G03F 7/70141; H01L 21/0273; H01L 21/0274; H01L 21/0338
See application file for complete search history.

(56) References Cited

U.S. PATENT DOCUMENTS

2001/0019412 A1   9/2001   David
2004/0259322 A1   12/2004  Lu et al.
(Continued)

OTHER PUBLICATIONS

Search Report for Application No. PCT/US 2020/054204, dated Jan. 21, 2021.

*Primary Examiner* — Thanhha S Pham
(74) *Attorney, Agent, or Firm* — Andrew R. Ralston; Charles A. Brill; Frank D. Cimino

(57) ABSTRACT

In examples, a method of manufacturing an integrated circuit comprises locating a photomask between a light source and a semiconductor wafer having a photoresist layer in a wafer scribe lane of the wafer, wherein the photomask comprises: a first mask scribe lane pattern; a second mask scribe lane pattern matching the first mask scribe lane pattern; and at least one circuit pattern of the integrated circuit located between the first and second mask scribe lane patterns. The method further includes illuminating the photomask to produce in the photoresist layer of the wafer scribe lane a first exposed portion corresponding to the second mask scribe lane pattern; locating the first mask scribe lane pattern between the light source and the first exposed portion; and illuminating the photomask, wherein the first mask scribe lane pattern substantially shields non-exposed portions of the photoresist layer of the wafer scribe lane from light exposure.

17 Claims, 9 Drawing Sheets

(56) References Cited

U.S. PATENT DOCUMENTS

2017/0221777 A1    8/2017  Sawano
2021/0082762 A1*  3/2021  Colin .................... H01L 21/78

* cited by examiner

INTEGRATED CIRCUIT WITH SCRIBE LANE PATTERNS FOR DEFECT REDUCTION

CROSS-REFERENCE TO RELATED APPLICATIONS

The present application claims priority to U.S. Provisional Patent Application No. 62/910,857, which was filed Oct. 4, 2019, is titled "ADVANCED FILL STEP COVER," and is hereby incorporated herein by reference in its entirety.

BACKGROUND

Semiconductor integrated circuits (ICs) are fabricated using photolithographic techniques on thin semiconductor disks commonly referred to as wafers. A side of the wafer where a majority of circuits are formed is commonly referred to as the device side or top side, and the opposite side is commonly referred to as the back side or bottom side. When forming the integrated circuits on the semiconductor wafer, a space between them separates the ICs into individual units or dies. Those spaces are termed wafer scribe lanes. The photolithographic techniques performed during fabrication of the integrated circuits on the semiconductor wafer use photolithographic patterns formed on a glass or other transparent plates which are commonly referred to as photomasks (or masks, or reticles).

In photolithographic processing, a photoresist layer is formed over the semiconductor wafer. This layer is formed of photosensitive material, meaning that the photoresist layer changes its characteristics when impinged by a specific wavelength (e.g., 190 nm) of light. The photoresist layer is used to control the specific wafer areas that are subjected to subsequent steps such as etch, implant, or oxide formation, for example. A photomask is then positioned, and light is used to transfer the pattern of the photomask onto the photoresist. The exposed photoresist (depending on the chemical composition, the photoresist can be a positive or negative resist) is then chemically developed, and areas of the photoresist are removed or are not removed depending on the pattern of the photomask.

SUMMARY

In examples, a method of manufacturing an integrated circuit comprises locating a photomask between a light source and a semiconductor wafer having a photoresist layer in a wafer scribe lane of the wafer, wherein the photomask comprises: a first mask scribe lane pattern; a second mask scribe lane pattern matching the first mask scribe lane pattern; and at least one circuit pattern of the integrated circuit located between the first and second mask scribe lane patterns. The method further includes illuminating the photomask to produce in the photoresist layer of the wafer scribe lane a first exposed portion corresponding to the second mask scribe lane pattern; locating the first mask scribe lane pattern between the light source and the first exposed portion; and illuminating the photomask, wherein the first mask scribe lane pattern substantially shields non-exposed portions of the photoresist layer of the wafer scribe lane from light exposure.

In examples, an integrated circuit comprises a plurality of dummy metal structures, each dummy metal structure located about at a lattice point of a same two-dimensional grid; and a die having a circuit formed thereupon in a circuit area, the circuit area located within the two-dimensional grid such that the circuit area is bordered on a first side by a first wafer scribe lane portion including a first subset of the dummy metal structures, and the circuit area is bordered on a second side by a second wafer scribe lane portion including a second subset of the dummy metal structures.

BRIEF DESCRIPTION OF THE DRAWINGS

For a detailed description of various examples, reference will now be made to the accompanying drawings in which.

DETAILED DESCRIPTION

Figure 1:
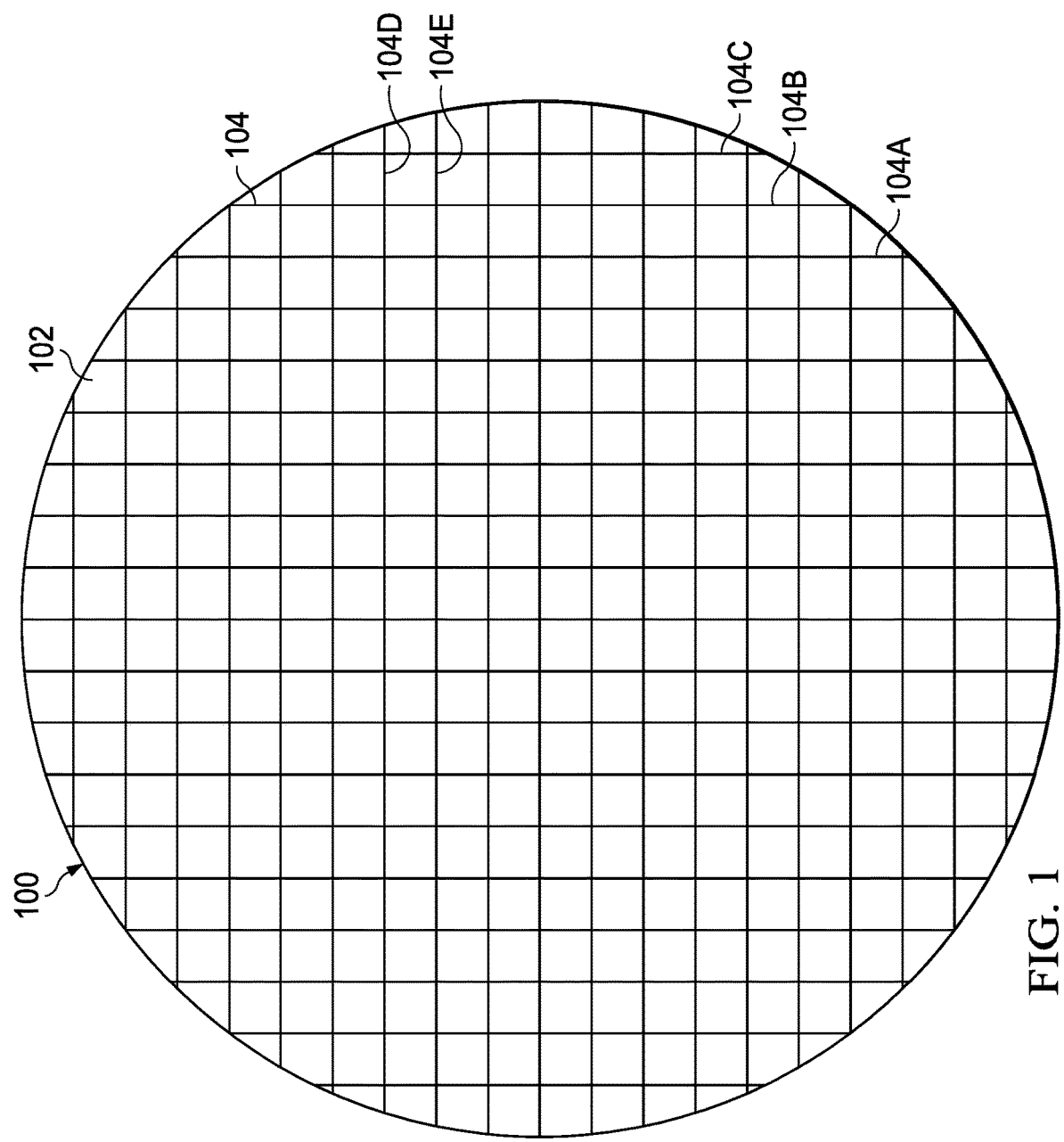
FIG. 1 depicts a top-down view of an illustrative semiconductor wafer, in accordance with various examples.

The standard 1:1 mask aligners, which had a one-to-one correspondence between the photomask pattern and the wafer pattern, have been replaced by steppers and scanners that use reduction optics technology. In steppers and scanners, a photomask pattern is projected and shrunk by a reduction factor, such as four or five times, onto the photoresist present on the wafer surface. The semiconductor wafer is repeatedly "stepped" from position to position in the stepper until a maximum surface coverage of the semiconductor wafer is achieved. At each stepping instance, different shots (i.e., groups of dies) of the wafer are aligned with the mask and exposed. The wafer is repeatedly exposed and processed with masks having different mask patterns in this manner, creating multiple layers of circuitry on each die of the wafer. The fabrication of the various components in each of the chips often uses more than a dozen of the masks in a specific order, each containing a pattern that is transferred to the photoresist, which is developed to form the desired sequence of patterns on the wafer.

After forming the desired circuit patterns, the wafer is separated (or singulated) into individual silicon dies. The separation into individual silicon dies is usually accomplished by sawing the semiconductor wafer through wafer scribe lanes via the use of a mechanical or laser apparatus. Since the semiconductor wafer is separated into individual silicon dies after the fabrication process is complete, the wafer scribe lanes may include structures that may have some transient benefit prior to singulation. For example, the wafer scribe lanes may include test sites (e.g., electrically functional test pads, frame cells) to evaluate the health of the circuit features fabricated in/on the semiconductor wafer before the wafer is sawed. Test pads are used to probe for defects in the electronic elements that are fabricated on the wafer. Frame cells are used for inline monitoring, such as the inline monitoring of the overlay (e.g. alignment) between different layers and the inline monitoring of the dimensions of electronic elements being fabricated.

In some cases, the wafer scribe lanes may also include other structures that are not electrically functional, but may confer some benefit to the manufacturing process, such as dummy metal structures (also called dummy fill). Dummy metal structures may be arbitrarily-shaped metal structures formed by patterning a metal layer (e.g., metal interconnect layer, top-level passivation layer, or additionally deposited metal layer over metal interconnect layer or top-level passivation layer) present underneath the photoresist. The dummy metal structures satisfy metal density specifications that may improve planarization of a particular area in the semiconductor wafer. Dummy metal structures may also assist in preventing the propagation of cracks during the sawing process. As a matter of terminology, the designated areas on a mask that are used to form structures such as dummy fill in the scribe lanes are referred to herein as "mask scribe lanes," and the scribe lanes of the wafer in which the structures (and the photoresist exposures used to form the structures) are actually formed are referred to herein as "wafer scribe lanes."

As is noted above, a mask may include multiple circuit patterns that are used to expose photoresist on multiple dies simultaneously (as noted above, each such group of multiple dies is referred to as a shot). On the mask, the group of one or more circuit patterns may conventionally be bordered on a first side by a first mask scribe lane having a first pattern related to one of the aforementioned non-functional structures (e.g., dummy fill), and the same group of circuit patterns may be bordered by a second mask scribe lane (opposite to the first mask scribe lane) that includes a cover pattern. The cover pattern, which is typically a long, continuous area called a dummy cover, prevents a wafer scribe lane that has already been exposed from being re-exposed when the wafer is stepped. (A double exposure may damage or completely remove the photoresist or result in unpredictable exposure.) Typically, the cover pattern is a large rectangular metal (e.g., chrome) block that protects the exposed first pattern from being double exposed in the subsequent exposure.

For example, due to the first exposure of a mask, one or more circuit patterns and the patterns present in mask scribe lanes leave their imprints on the photoresist. Following the first exposure, the stepper steps the wafer to an adjacent position for a second exposure. The stepper steps the wafer such that the cover pattern of the mask aligns with (overlaps) the wafer scribe lane in which the first pattern was imprinted/exposed to prevent that wafer scribe lane from being exposed again, thereby preventing the exposed area of the photoresist from being damaged. In other words, the cover pattern in the second mask scribe lane, during the second exposure, covers and protects the previously exposed pattern from being exposed again during the second exposure.

In cases where the mask is near or at the edge of the semiconductor wafer, the cover pattern may protect an unexposed wafer scribe lane such that the photoresist in that wafer scribe lane is not exposed at all. Such scenarios may result in an unpatterned metal layer in the wafer scribe lane. The presence of an unpatterned metal layer in a wafer scribe lane can be disruptive during the scribing/sawing wafer process as sawing through the unpatterned metal layer can cause issues, such as chip-out and delamination. Dies adjacent to the scribe lanes with unpatterned metal layers may be damaged and fail during post-sawing inspections. Those dies are deemed unfit to ship to the customer, thus resulting in yield loss. Therefore, fabrication methods and devices are needed to overcome this yield loss issue.

Accordingly, the present disclosure describes a method of fabricating integrated circuits using a mask design that mitigates the yield loss issue. Specifically, the present disclosure describes the use of a mask with a first mask scribe lane having a pattern that is used to expose a wafer scribe lane in a particular manner and a second mask scribe lane that is opposite the first mask scribe lane and that comprises a cover pattern, e.g. dummy metal features, that is substantially similar to the pattern in the first mask scribe lane. Using such a mask design ensures that each component of the cover pattern in the second mask scribe lane acts as an exact (or near-exact) cover for the photoresist imprint generated by the pattern in the first mask scribe lane during the preceding shot exposure. Using such a mask design is technically advantageous at least because it may improve the overall yield. For simplicity's sake, the remainder of this disclosure assumes that the wafer scribe lanes of the semiconductor wafer only include dummy metal structures (i.e., dummy fill). In other examples, the wafer scribe lanes may include different types of non-functional sites. As such, in those examples, both the first and second patterns will include patterns for the same non-functional sites such that the cover pattern in the second mask scribe lane acts as a cover for structures formed by the pattern in the first mask scribe lane during adjacent shot exposures.

The examples described in this disclosure may be applied in a wide variety of contexts. The specific examples disclosed herein are illustrative and do not limit the scope of this disclosure.

FIG. 1 depicts a top-down view of an illustrative semiconductor wafer 100, in accordance with various examples. The wafer 100 includes a semiconductor substrate, which, in some examples, may be a silicon substrate. Alternatively, the semiconductor substrate may comprise germanium, silicon germanium, an III-V compound semiconductor material, or the like. The wafer 100 includes multiple shots 102 and multiple wafer scribe lanes 104 separating the shots 102 from each other. Each of the shots 102 comprises a single die or, more commonly, a group of dies (not expressly depicted in FIG. 1). For example, a single shot 102 may include a 2×2 or 3×3 array of dies. Each of the dies in each shot 102 may have a circuit formed thereupon by performing a series of photolithography and etching processes using one or more masks. In some examples, the same circuit is formed on some or all of the multiple dies in a shot 102, and in some such examples, the same circuit is formed on some or all of the multiple dies on the entire wafer 100. (For the sake of clarity, circuit patterns formed on the wafer 100 are not depicted in FIG. 1, nor are any structural elements that may be present in the wafer scribe lanes 104. However, wafer scribe lanes 104 are shown in greater detail in FIG. 2.) As shown, some or all of the shots 102 are circumscribed by multiple wafer scribe lanes 104. For example, a shot 102 may have four sides, each of which abuts a different wafer scribe lane 104. In addition, when each shot 102 itself contains multiple dies, each of these dies is circumscribed by a set of wafer scribe lanes 104. Not all of the wafer scribe lanes 104 circumscribing all dies of the wafer 100 are shown in FIG. 1. Rather, only those wafer scribe lanes 104 circumscribing shots 102 are shown in FIG. 1. Thus, for example, wafer scribe lanes 104 that pass through the shots 102 (either horizontally or vertically) without circumscribing the shots 102 are omitted from FIG. 1 to improve clarity and to facilitate understanding. Although all of the wafer scribe lanes of the wafer 100 are labeled with numeral 104, some of the wafer scribe lanes 104 are labeled more particularly as 104A-104E and are described below with reference to FIG. 2.

Figure 2:
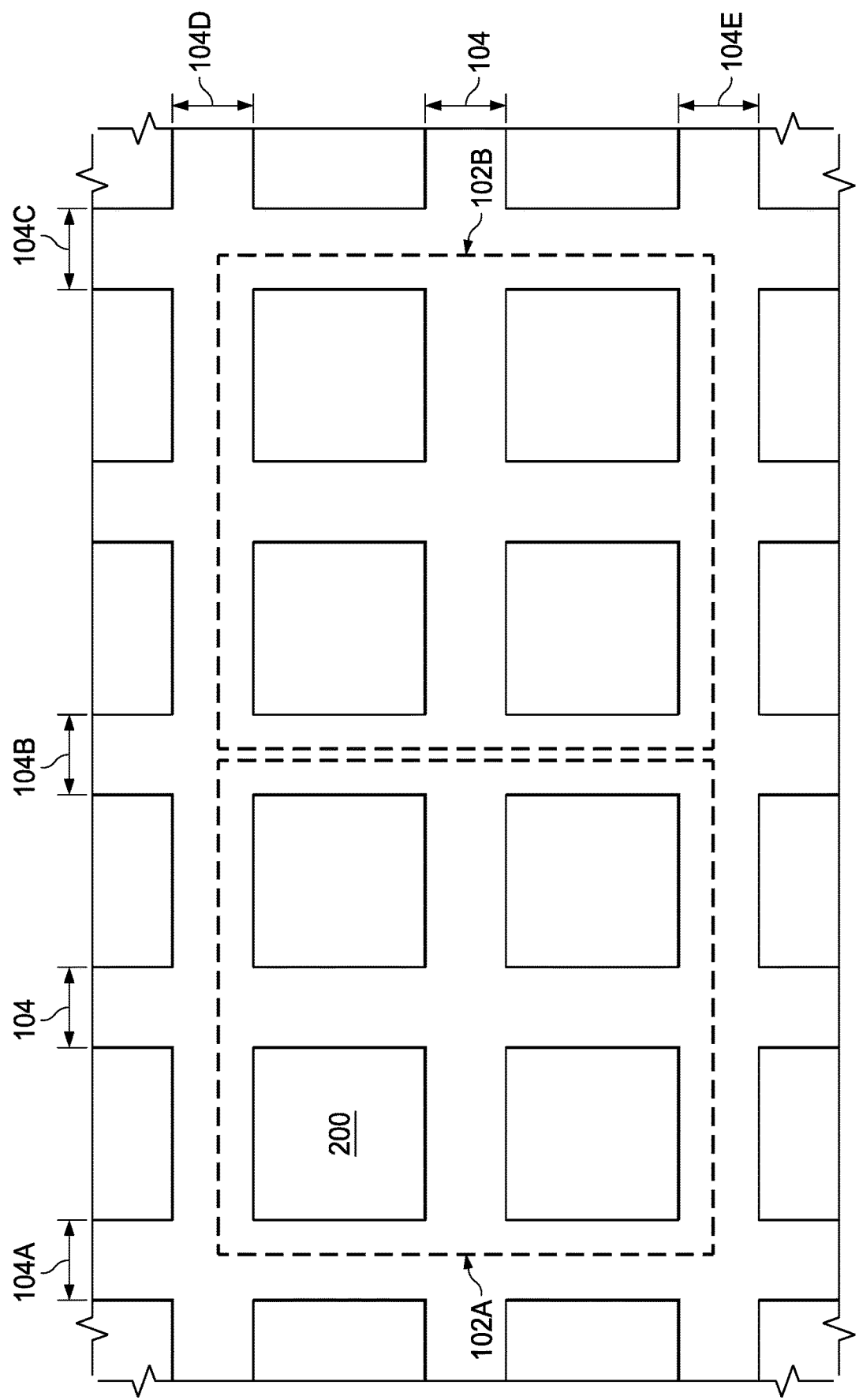
FIG. 2 depicts a top-down view of a pair of shots of a semiconductor wafer, in accordance with various examples.

FIG. 2 depicts a detailed view of a pair of adjacent shots 102. In this example, these adjacent shots are labeled as 102A and 102B. As also shown, each of the shots 102A, 102B contains a 2×2 array of dies 200 (although in other examples, other arrays of dies may be used, such as 3×3, 4×4, 5×5, and 10×10 arrays). Each of the dies 200 is circumscribed by multiple wafer scribe lanes 104. All of the wafer scribe lanes shown in FIG. 2 are labeled with the numeral 104, but the wafer scribe lanes 104 that circumscribe the shots 102A, 102B are labeled more particularly as 104A-104E.

Figure 3:
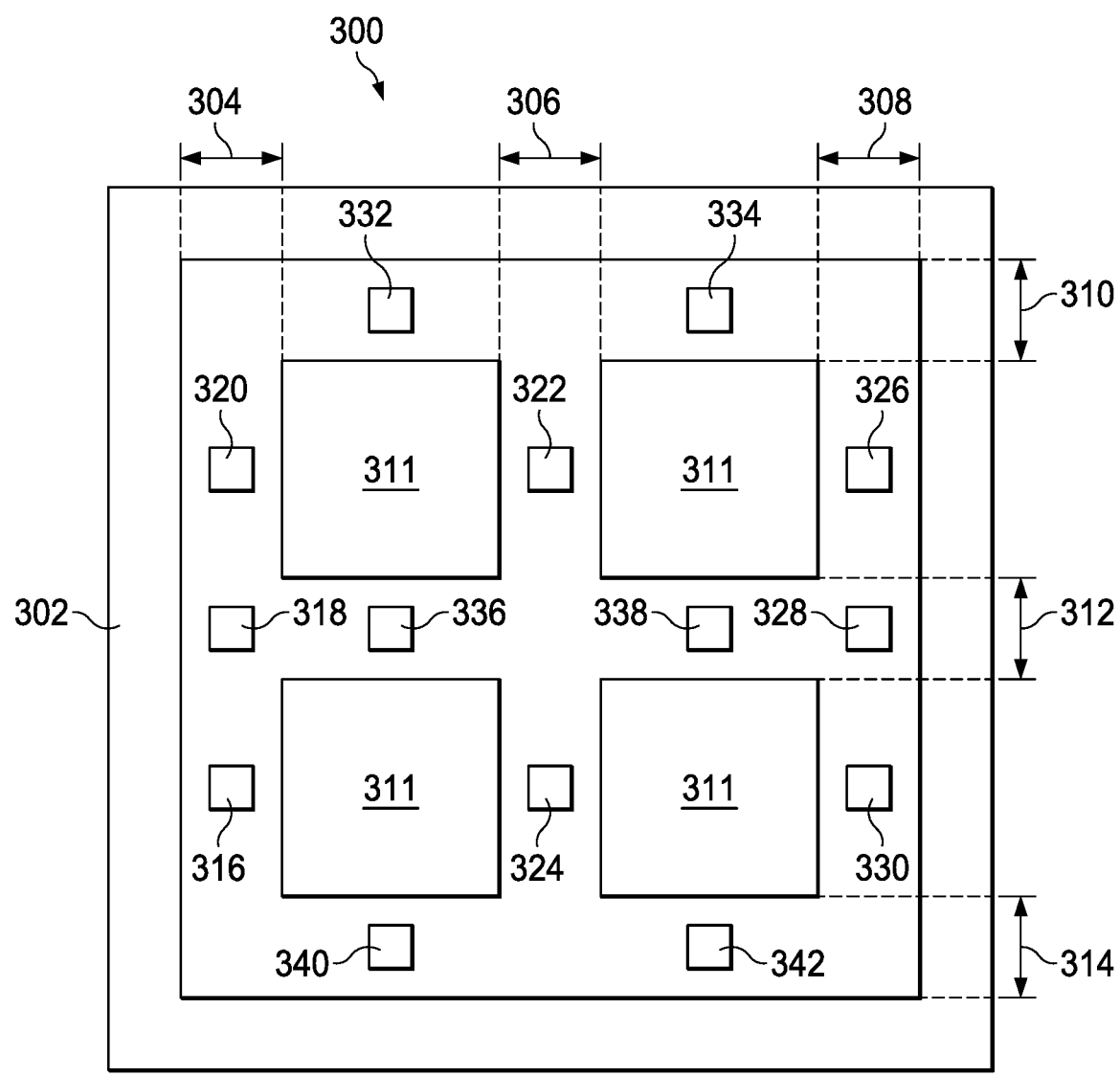
FIG. 3 depicts a top-down view of a photomask, in accordance with various examples.

As explained above, the wafer 100 is aligned with a mask (shown in FIG. 3) to simultaneously expose all dies on the mask in a single shot and to simultaneously expose the wafer scribe lanes circumscribing that shot. The wafer 100 is then stepped so that the mask aligns with an adjacent shot (e.g., an immediately adjacent shot) and the process is repeated. FIG. 3 depicts such a mask (or reticle) 300. The mask 300 comprises a frame 302 and multiple die plates 311 that are circumscribed by multiple mask scribe lanes 304, 306, 308, 310, 312, and 314. In some examples, the number of die plates 311 matches the number of dies 200 in each shot 102 (FIG. 2).

The mask 300 includes a glass (or quartz) plate that may be approximately 15-20 cm on each side. The die plates 311 and the mask scribe lanes 304, 306, 308, 310, 312, and 314 are coated with a thin metal layer (for example, chrome) that may have a thickness of approximately 100 nm. A pattern is formed in the metal layer, such that the pattern includes both metal and transparent glass regions. The transparent glass region of the pattern allows light from the stepper/scanner to pass through. The metal region of the pattern blocks light transmission. In this manner, light is used to project the pattern onto the dies 200 and the wafer scribe lanes 104 (FIG. 2). The pattern on the die plates 311 is omitted to facilitate ease of explanation, but illustrative patterns in the mask scribe lanes are shown. Specifically, the mask 300 includes pattern features 316, 318, and 320 in mask scribe lane 304; pattern features 322 and 324 in mask scribe lane 306; pattern features 326, 328, and 330 in mask scribe lane 308; pattern features 332 and 334 in mask scribe lane 310; pattern features 318, 328, 336 and 338 in mask scribe lane 312; and pattern features 340 and 342 in mask scribe lane 314. In some examples, the pattern features 316, 318, and 320 are identical or nominally identical to the pattern features 330, 328, and 326, respectively. Similarly, the pattern features 332, 334 are identical to nominally identical to the pattern features 340, 342, respectively. In some examples, some or all of the various pattern features in the mask scribe lanes form a dummy fill pattern. In some examples, the pattern features are more numerous (e.g., in the thousands, hundreds of thousands, or millions) than shown in FIG. 3. In some examples, other types of pattern features in other quantities are used. In some examples, some or all of the pattern features in a mask scribe lane are identical or nominally identical (e.g., nominally identical geometric shapes and/or sizes, such as squares, circles, hexagons, triangles, or rectangles measuring approximately 0.4 microns by 2.5 microns; more complex shapes also may be used, such as bowties and chevrons, and the scope of disclosure encompasses any and all possible shapes). The scope of disclosure is not limited to any particular type of mask scribe lane pattern features or pattern.

Referring now to FIGS. 2 and 3, in a manufacturing process, a stepper/scanner aligns the mask 300 with a shot 102 of a wafer 100, such as the shot 102A of FIG. 2. The stepper/scanner then emits light that passes through the transparent portions of the mask 300 and onto the corresponding portions of photoresist on the shot 102A. For example, the pattern formed on each of the die plates 311 causes light to expose the photoresist on the corresponding dies 200 of shot 102A in accordance with the pattern. Similarly, the patterns (e.g., dummy fill patterns) formed by the pattern features in the mask scribe lanes 304, 306, 308, 310, 312, and 314 cause light to expose the photoresist in the corresponding wafer scribe lanes 104 consistent with the patterns in the mask scribe lanes. For instance, the photoresist in the wafer scribe lane 104A is exposed consistent with the pattern formed by the pattern features 316, 318, and 320. The same is true, for example, for the pattern features 326, 328, and 330 vis-à-vis the wafer scribe lane 1046; for the pattern features 332, 334 vis-à-vis the wafer scribe lane 104D; the pattern features 340, 342 vis-à-vis the wafer scribe lane 104E; and so on.

Figure 4:
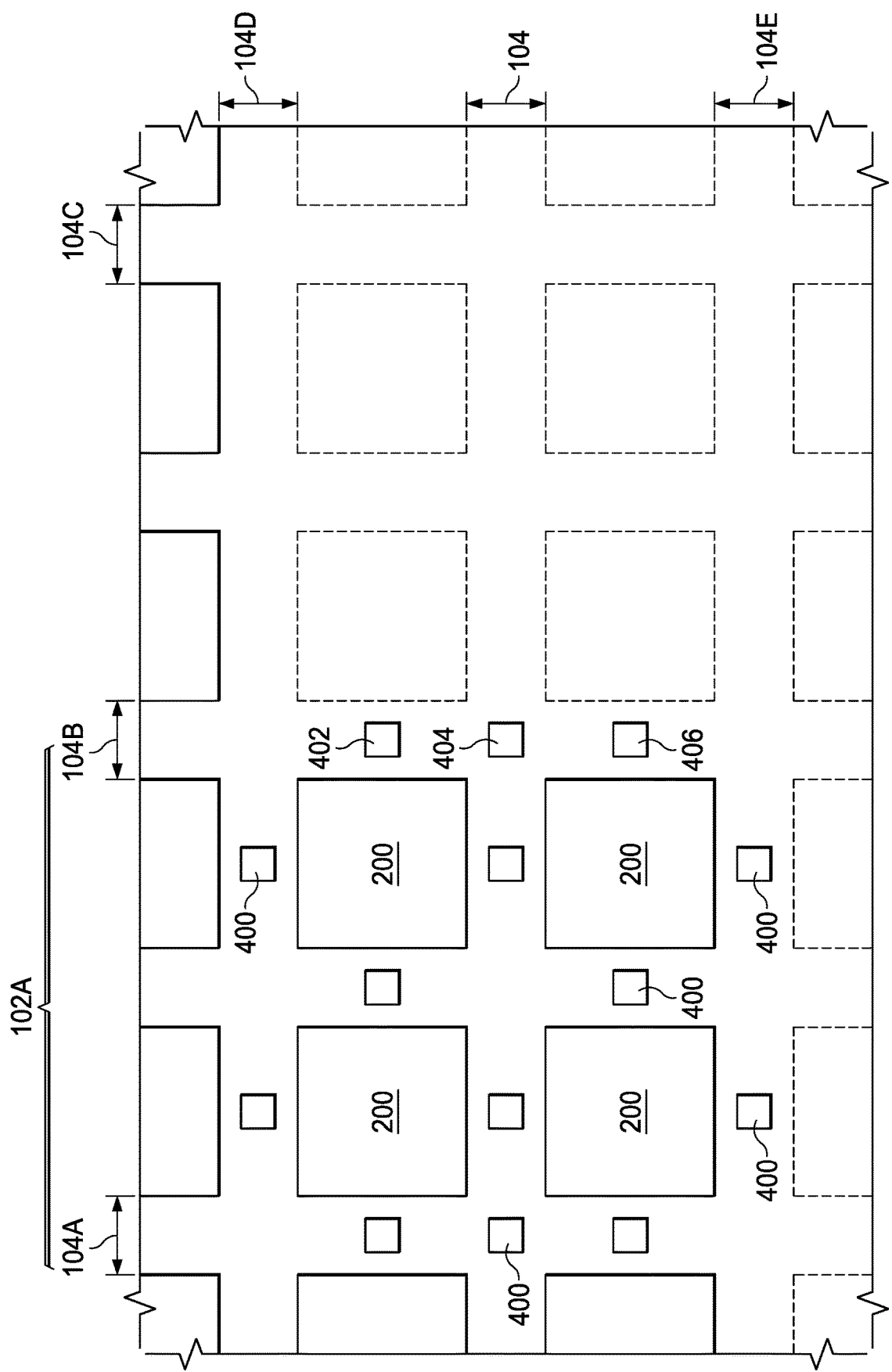
FIG. 4 depicts a top-down view of a pair of shots of a semiconductor wafer, in accordance with various examples.

The resulting exposed areas of photoresist in the wafer scribe lanes 104A, 1046, 104D, and 104E are depicted in FIG. 4. FIG. 4 is similar to FIG. 2 but with the dashed lines indicating the shots 102A, 102B removed for clarity and the exposed areas of the photoresist in the wafer scribe lanes 104A, 104B, 104D, and 104E indicated by numeral 400. FIG. 4 shows without implied limitation an example in which the mask 300 is stepped relative to the wafer surface from left to right and from top to bottom. Thus, instances of the dies 200 that have been exposed are shown having solid lines, while locations of instances yet to be exposed are shown having dashed lines. As shown, the photoresist in several of the scribe lanes 104 is unexposed. For example, the photoresist in the wafer scribe lane 104C is unexposed, as are portions of the photoresist in the wafer scribe lanes 104D and 104E. These areas of photoresist are unexposed because the mask 300 was aligned with the shot 102A and not yet with the shot 102B (FIG. 2).

After the areas of photoresist are exposed in the wafer scribe lanes as shown in FIG. 4, the wafer 100 is stepped so that the mask 300 is aligned with the shot 102B (FIG. 2). For example, the pattern features 316, 318, and 320 in the mask scribe lane 304 are aligned with the exposed areas of photoresist 406, 404, and 402, respectively, in wafer scribe lane 104B; the pattern features 326, 328, and 330 are located over the unexposed photoresist in the wafer scribe lane 104C. Light is then passed through the transparent areas of the mask 300. Because the pattern features 316, 318, and 320 in the mask scribe lane 304 are aligned with the exposed areas of photoresist 402, 404, and 406, and further because the pattern features 316, 318, and 320 are identical or nominally identical to the pattern features 330, 328, and 326 (respectively) that formed the exposed areas of photoresist 406, 404, and 402, respectively, when light is passed through the mask 300 during alignment with the shot 102B, no areas of the photoresist in the wafer scribe lane 104B are exposed other than the areas 402, 404, and 406 that have already been exposed. In addition, other areas of photoresist in the various wafer scribe lanes 104 are exposed.

Figure 5:
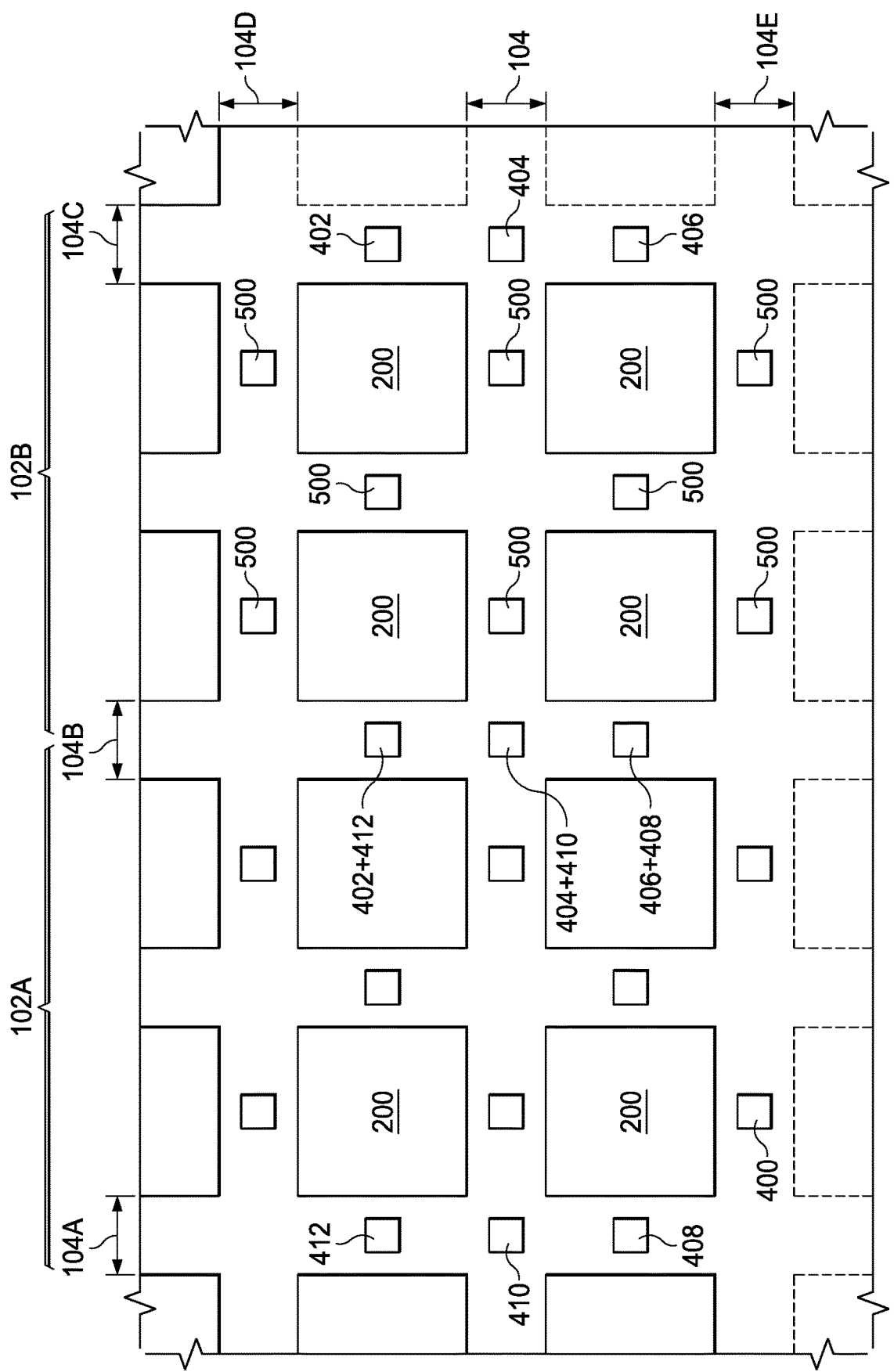
FIG. 5 depicts a top-down view of a pair of shots of a semiconductor wafer, in accordance with various examples.

FIG. 5 shows the exposed area of the wafer after exposure of the shot 102B. IN scribe lane 104B, previously exposed areas 402, 404 and 406 are exposed again with the respective pattern features 320, 318 and 316, and are thus labeled 402+412, 404+410, and 406+408. FIG. 5 additionally depicts newly-exposed areas 500 formed in, e.g., the wafer scribe lanes 104C, 104D, and 104E. In some examples, because the areas 402+412, 404+410, and 406+408 are double-exposed, these areas may be a different size (e.g., smaller) than the area 402, 412 and 406 due to alignment variation of the mask to the wafer with each exposure shot. In some examples, the double exposed areas may be about 0.16 square microns smaller in area than similar areas 400, 500 that have been single-exposed, reflecting an alignment tolerance of ±0.2 microns in the vertical and horizontal directions. However, the difference is size is expected to be variable and may average nil.

This process of exposing photoresist on the wafer 100, stepping the wafer 100, again exposing the photoresist, again stepping the wafer 100, and so on continues until the end of the wafer is reached. For instance, when the mask 300 is aligned with the final shot 102 prior to reaching the edge of the wafer 100, the pattern features 326, 328, and 330 (FIG. 3) are positioned over photoresist in the final wafer scribe lane that is adjacent to the circumference of the wafer 100 (e.g., wafer scribe lane 104C in FIG. 1), and the pattern features 314, 316, and 318 are aligned with areas of photoresist in the third-to-last wafer scribe lane that have already been exposed. With this alignment in place, light is passed through the mask 300, exposing areas of photoresist in the final wafer scribe lane that correspond to the pattern features 326, 328, and 330. In addition, no new areas of photoresist in the third-to-last wafer scribe lane are exposed, since the pattern features 316, 318, and 320 are aligned with the already-exposed areas of photoresist in the third-to-last wafer scribe lane, and because the already-exposed areas of photoresist in the third-to-last wafer scribe lane were formed by the pattern features 326, 328, and 330, which are identical or nominally identical to the pattern features 320, 318, and 316, respectively. When the exposure is complete, the final wafer scribe lane is not further exposed (e.g., by another mask scribe lane, such as the mask scribe lane 104A in FIG. 1). The scope of this disclosure is not limited to stepping wafers in any particular direction. Wafers may be stepped from left to right or vice versa, from top to bottom or vice versa, randomly, or using any other technique. The techniques described herein are applicable regardless of the stepping technique used.

As a result of using this technique, many of the wafer scribe lanes on the wafer 100 are double exposed (with the second exposure being in an identical or nearly-identical manner as the first exposure). This is because each time the wafer 100 is shifted between shot exposures, one of the mask scribe lanes is used to re-expose photoresist in a wafer scribe lane that was already exposed prior to the latest wafer shift. This is true for the various wafer scribe lanes 104 circumscribing each of the shots 102 (FIG. 1) except for the outermost wafer scribe lanes 104 of the wafer 100. Such double exposure does not harm the photoresist or otherwise negatively affect the photolithography process, since both exposures are performed in an identical or nominally identical manner using an identical or nominally identical mask pattern.

Much of this description assumes that the wafer 100 is stepped from right to left. However, the masks and techniques described herein may also be adapted for use when the wafer 100 is stepped from left to right. Similarly, the masks and techniques described herein may be adapted for use when the wafer 100 is stepped vertically from a lower position to a higher position or vice versa. The masks and techniques may be adapted for use when the wafer is stepped in multiple (horizontal and vertical) directions.

Figure 6:
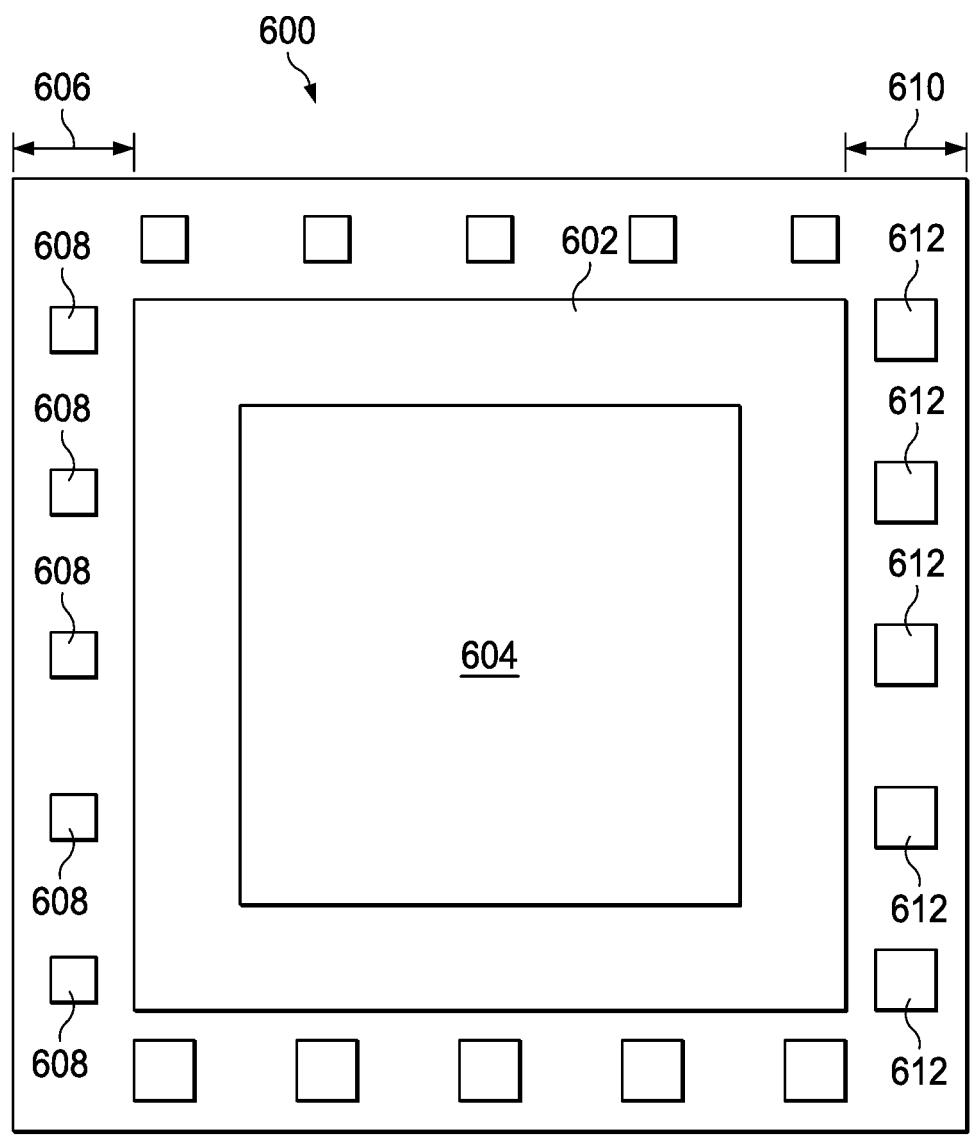
FIG. 6 depicts an integrated circuit package manufactured using the techniques described herein, in accordance with various examples.

FIG. 6 depicts contents of an example integrated circuit die 600 manufactured using the techniques described herein, as well as any additional steps that may be suitable (e.g., etching steps). The die 600 comprises an internal region 602 having a circuit 604 formed thereupon. The die 600 further includes a first wafer scribe lane portion 606 (e.g., a post-singulation wafer scribe lane) abutting the internal region 602 and comprising a first plurality of dummy metal structures 608. The die 600 also comprises a second wafer scribe lane portion 610 opposite the first wafer scribe lane portion 606, the second wafer scribe lane portion 610 abutting the internal region 602 and comprising a second plurality of dummy metal structures 612. Each of the first plurality of dummy metal structures 608 may be a different size (e.g., smaller) than a corresponding structure in the second plurality of dummy metal structures 612 (although the shapes of these corresponding structures may be identical or nominally identical). However, the scope of the disclosure includes examples in which the dummy metal structures 608 and 612 are essentially the same size within measurement precision. In addition, each of the first plurality of dummy metal structures 608 has a nominally identical shape to a corresponding structure in the second plurality of dummy metal structures 612. The shapes included in the scope of this disclosure are limitless and may include, merely as examples, squares, rectangles, triangles, chevrons, bowties, circles, etc. The structures in the first plurality of dummy metal structures 608 may be a different size than the corresponding structures in the second plurality of dummy metal structures 612 because the structures in the first plurality of dummy metal structures 608 are formed by double exposure, as described in detail above. The misalignments between shots may be, e.g. ±0.2 microns in the vertical and horizontal directions. Thus the double exposures may cause the structures to decrease in size, for example by 0.4 microns in length and width, thus resulting in an illustrative, approximate decrease in area of 0.16 square microns. The structures in the second plurality of dummy metal structures 612, by contrast, are formed by a single exposure, for instance by using patterns in mask scribe lane 306 (FIG. 3). Similar dummy metal structures may be formed in the wafer scribe lane portions orthogonal to the wafer scribe lane portions 606 and 610, as shown.

Figure 7:
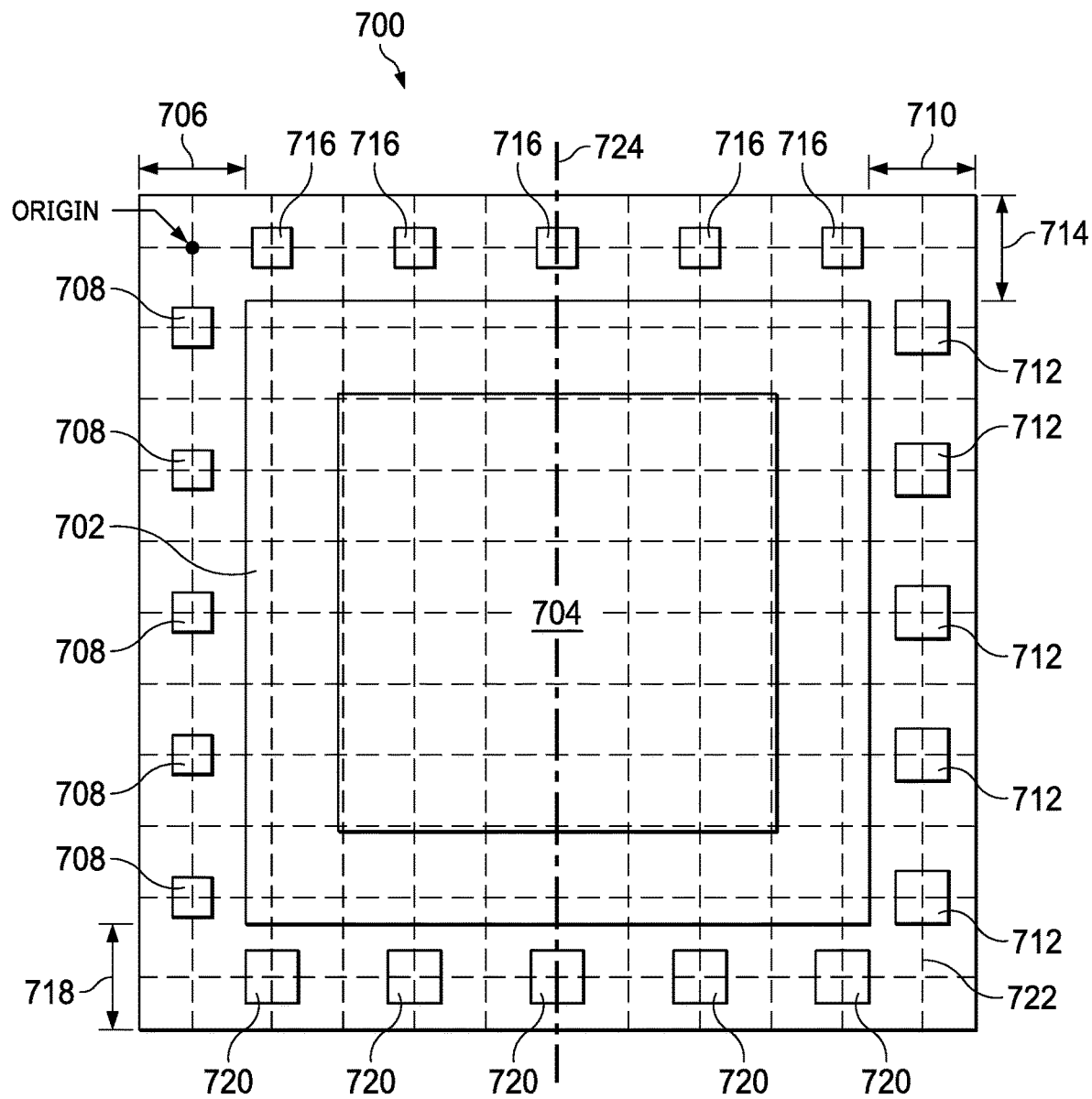
FIG. 7 depicts an integrated circuit package manufactured using the techniques described herein, in accordance with various examples.

FIG. 7 depicts another example integrated circuit die 700 manufactured using the techniques described herein, as well as any other steps that may be suitable, such as etching steps. The die 700 includes an internal region 702 having one or more circuits 704 formed thereupon. The one or more circuits are located in a circuit area of the die, which excludes the scribe lane portions of the die and any test modules or similar circuits that may be located in the scribe lane portions. The die 700 further includes a first wafer scribe lane portion 706 abutting the internal region 702 and comprising a first plurality of dummy metal structures 708. The die 700 also comprises a second wafer scribe lane portion 710 opposite the first wafer scribe lane portion 706, the second wafer scribe lane portion 710 abutting the internal region 702 and comprising a second plurality of dummy metal structures 712. The die 700 further includes a third wafer scribe lane portion 714 abutting the internal region 702 and comprising a third plurality of dummy metal structures 716. The die 700 further comprises a fourth wafer scribe lane portion 718 abutting the internal region 702 and comprising a fourth plurality of dummy metal structures 720. The wafer scribe lane portions 706 and 710 are approximately parallel to each other, and the wafer scribe lane portions 714 and 718 are approximately parallel to each other. The wafer scribe lane portion 706 is approximately orthogonal to the wafer scribe lane portions 714 and 718, and the wafer scribe lane portion 710 is also approximately orthogonal to the wafer scribe lane portions 714 and 718.

As shown, the dummy metal structures 708, 712, 716, and 720 are located on or about lattice points, or grid points, of a two-dimensional grid 722. (The grid 722 is for illustrative purposes and is not itself physically manifested in the die 700 other than by the locations of the dummy fill structures 708, 712, 716, and 720 relative to each other.) The grid 722 has an origin within the die 700 area, shown for example as the upper left corner. The grid 722 may extend uniformly over the one or more die and scribe lanes of the mask 300. Thus at least dummy fill structures in perimeter mask scribe lanes 304, 308, 310 and 314 on the mask 300 may be located at lattice points of a same uniform grid. Optionally, dummy fill structures that are not in a perimeter mask scribe lane, e.g. pattern features 322, 324, 336 and 338, may also be located at lattice points of the uniform grid. The dies 700, prior to having been singulated from their wafers, may have been located abutting wafer scribe lanes in which double exposures occurred, as explained in detail above. Furthermore, although the grid 722 is depicted as being a rectangular grid, other grid types are contemplated and fall within the scope of this disclosure, including square grids, hexagonal grids and skewed grids (grids in which the points are located at vertices of an array of parallelograms). Further, in some examples, the dummy metal structures 708, 712, 716, and 720 are arranged such that when dummy metal structures of a first subset are translated along an axis of the die (e.g., axis 724), each dummy metal structure of the first subset directly overlies a corresponding dummy metal structure of a second subset.

Figure 8:
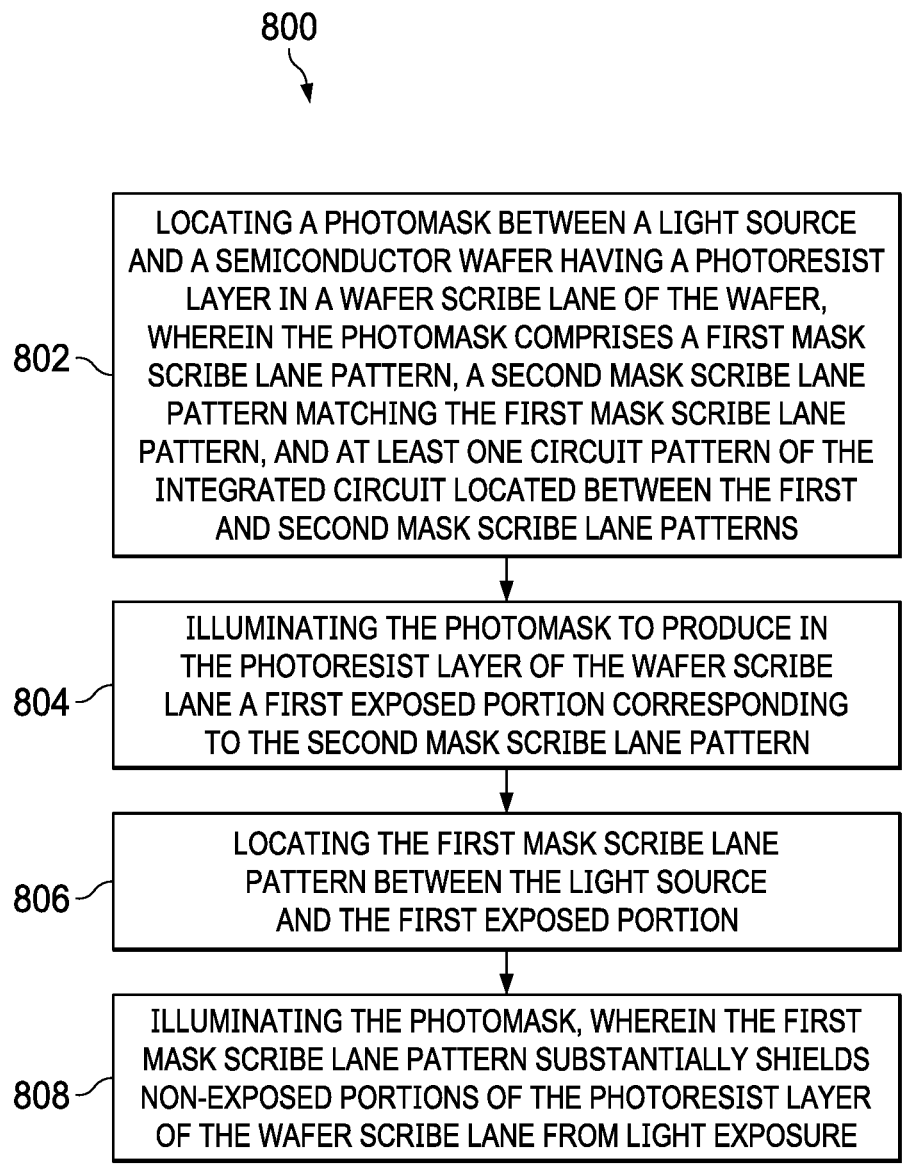
FIGS. 8 and 9 depict flow diagrams of methods for manufacturing an integrated circuit package, in accordance with various examples.
Figure 9:
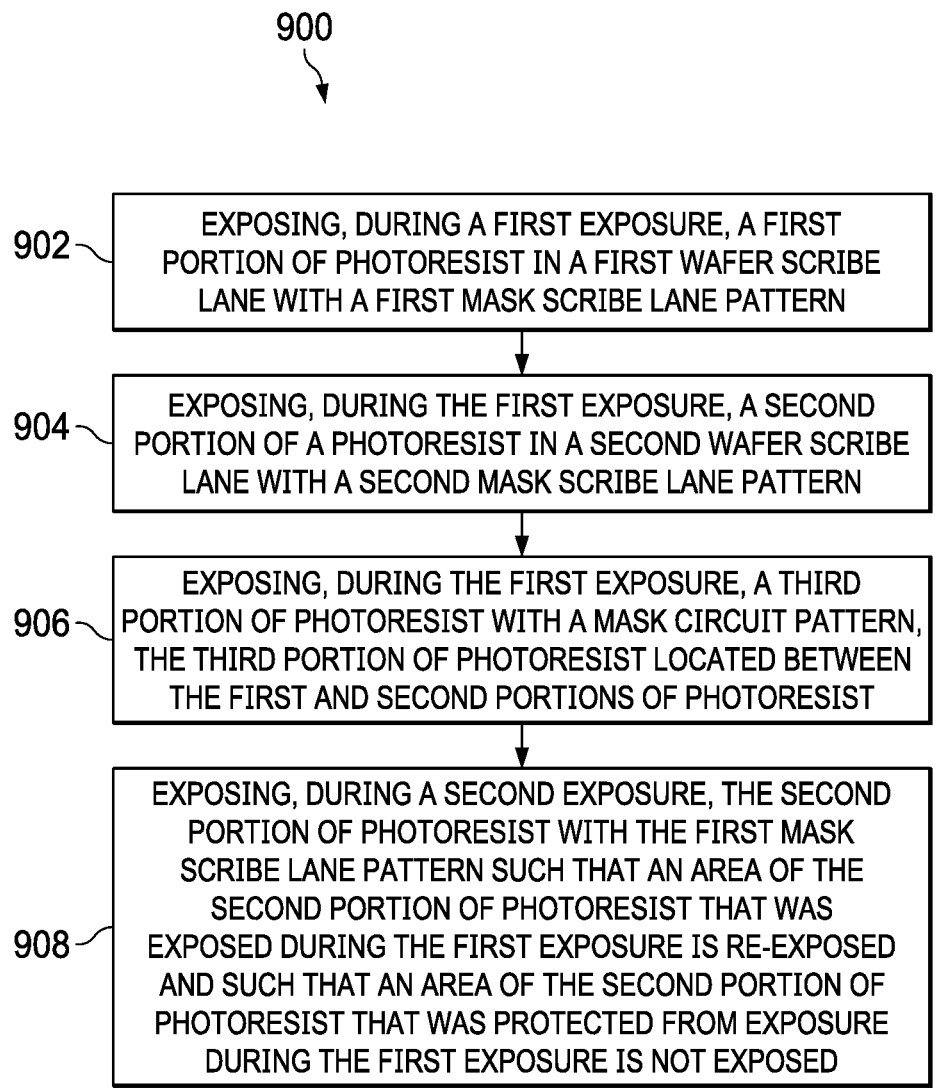

FIGS. 8 and 9 depict flow diagrams of methods for manufacturing an integrated circuit die, in accordance with various examples. Referring to FIG. 8, a method 800 begins by locating a photomask between a light source and a semiconductor wafer having a photoresist layer in a wafer scribe lane of the wafer (802). The photomask comprises a first mask scribe lane pattern, a second mask scribe lane pattern matching the first mask scribe lane pattern, and at least one circuit pattern of the integrated circuit located between the first and second mask scribe lane patterns. (The term "matching," as applied to mask scribe lane patterns herein, denotes multiple mask scribe lanes, each of the mask scribe lanes including one or more pattern features that finds a corresponding pattern feature(s) of nominally identical size, shape, and location in the remaining mask scribe lane(s), with the location being at a grid point of a two-dimensional grid that overlays the multiple mask scribe lanes, as described elsewhere herein. Matching mask scribe lane patterns do not exclude the presence of features in one or more of the mask scribe lanes that may shield other, non-dummy fill structures from double exposure, such as parametric test modules, alignment marks, etc. Thus, it is possible that only portions of matching mask scribe lane patterns have features that correspond to each other.) The method 800 also comprises illuminating the photomask to produce in the photoresist layer of the wafer scribe lane a first exposed portion corresponding to the second mask scribe lane pattern (804). The method 800 further comprises locating the first mask scribe lane pattern between the light source and the first exposed portion (806). The method 800 additionally comprises illuminating the photomask, wherein the first mask scribe lane pattern shields non-exposed portions of the photoresist layer of the wafer scribe lane from light exposure (808). The term "substantially shields" as used with respect to the action of step 808 means that a minor fractional area, e.g. less than 30%, of non-exposed portions of the photoresist layer on the wafer scribe lane may be exposed, for example, due to misalignment between the photomask and the wafer produced by the stepper machine. Such minor variations are to be expected and are accounted for by use of the term "substantially shields."

Referring now to FIG. 9, a method 900 begins by exposing, during a first exposure, a first portion of photoresist in a first wafer scribe lane with a first mask scribe lane pattern (902). The method 900 further comprises exposing, during the first exposure, a second portion of photoresist in a second wafer scribe lane with a second mask scribe lane pattern (904). The method 900 also comprises exposing, during the first exposure, a third portion of photoresist with a mask circuit pattern, the third portion of photoresist located between the first and second portions of photoresist (906). The method 900 further comprises exposing, during a second exposure, the second portion of photoresist with the first mask scribe lane pattern such that an area of the second portion of photoresist that was exposed during the first exposure is re-exposed and such that an area of the second portion of photoresist that was protected from exposure during the first exposure is not exposed by the second exposure (908).

In the foregoing discussion and in the claims, the terms "including" and "comprising" are used in an open-ended fashion, and thus should be interpreted to mean "including, but not limited to . . . ." Unless otherwise stated, "about," "approximately," or "substantially" preceding a numerical value means+/−10 percent of the stated value. When two components are "nominally identical," the difference(s) between the two components is so negligible that one of ordinary skill in the art would consider the two components to be identical as a practical matter.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A method of manufacturing an integrated circuit, comprising:
    locating a photomask between a light source and a semiconductor wafer having a photoresist layer in a wafer scribe lane of the wafer, wherein the photomask comprises:
        a first mask scribe lane pattern;
        a second mask scribe lane pattern matching the first mask scribe lane pattern; and
        at least one circuit pattern of the integrated circuit located between the first and second mask scribe lane patterns;
    illuminating the photomask to produce in the photoresist layer of the wafer scribe lane a first exposed portion corresponding to the second mask scribe lane pattern;
    locating the first mask scribe lane pattern between the light source and the first exposed portion; and
    illuminating the photomask, wherein the first mask scribe lane pattern substantially shields non-exposed portions of the photoresist layer of the wafer scribe lane from light exposure.

2. The method of claim 1, wherein the first mask scribe lane pattern matches the first exposed portion.

3. The method of claim 1, wherein the photomask includes a plurality of chip patterns, each of the chip patterns being nominally identical.

4. The method of claim 1, wherein the first and second mask scribe lane patterns comprise dummy fill patterns.

5. The method of claim 1, further comprising illuminating the photomask to produce in the photoresist layer a second exposed portion of a second scribe lane corresponding to the second mask scribe lane pattern, the second wafer scribe lane being adjacent to a circumference of the wafer.

6. A method of manufacturing an integrated circuit, comprising:
- exposing, during a first exposure, a first portion of photoresist in a first wafer scribe lane with a first mask scribe lane pattern;
- exposing, during the first exposure, a second portion of photoresist in a second wafer scribe lane with a second mask scribe lane pattern;
- exposing, during the first exposure, a third portion of photoresist with a mask circuit pattern, the third portion of photoresist located between the first and second portions of photoresist; and
- exposing, during a second exposure, the second portion of photoresist with the first mask scribe lane pattern such that an area of the second portion of photoresist that was exposed during the first exposure is re-exposed and such that an area of the second portion of photoresist that was protected from exposure during the first exposure is not exposed.

7. The method of claim 6, wherein the first mask scribe lane pattern matches the second mask scribe lane pattern.

8. The method of claim 6, wherein the first mask scribe lane pattern is usable to fabricate a dummy fill.

9. The method of claim 6, wherein the first mask scribe lane pattern includes a uniform array of nominally identical geometric shapes.

10. The method of claim 6, wherein exposed areas in the first portion of photoresist and exposed areas in the second portion of photoresist are located about at a lattice point of a same two-dimensional grid.

11. A method of manufacturing an integrated circuit, comprising:
- in a first exposure exposing a photoresist layer over a semiconductor substrate using a mask including first and second scribe lane patterns including a plurality of mask features, the exposing producing a plurality of exposed regions of the photoresist layer from the second scribe lane pattern;
- translating the semiconductor substrate with respect to the mask such that first scribe lane pattern overlies the plurality of exposed regions;
- in a second exposure exposing the plurality of exposed regions a second time corresponding to the mask features in the first scribe lane pattern.

12. The method of claim 11, wherein the mask features in the first scribe lane pattern and in the second scribe lane pattern are located at lattice points of a same uniform grid.

13. The method of claim 11, wherein the mask features describe dummy fill features.

14. The method of claim 11, wherein the mask features are nominally identical geometric shapes.

15. The method of claim 11, wherein the mask includes third and fourth scribe lane patterns including a further plurality of mask features, and the first exposure produces a further plurality of exposed regions of the photoresist layer from the third scribe lane pattern, and further comprising:
- translating the semiconductor substrate with respect to the mask such that fourth scribe lane pattern overlies the further plurality of exposed regions; and
- in a third exposure exposing the further plurality of exposed regions corresponding to the mask features in the fourth scribe lane pattern.

16. The method of claim 15, wherein the mask features in the first, second, third and fourth scribe lane patterns are located at lattice points of a same uniform grid.

17. The method of claim 11, wherein the first exposure exposes one or more integrated circuit die located between the first and second scribe lane patterns.

\* \* \* \* \*